(12) United States Patent
Chang et al.

(10) Patent No.: US 9,251,953 B2
(45) Date of Patent: Feb. 2, 2016

(54) METHOD OF MANUFACTURING A COMMON MODE FILTER

(71) Applicant: INPAQ TECHNOLOGY CO., LTD., Miaoli (TW)

(72) Inventors: Yu Chia Chang, Taichung (TW); Chi Long Lin, Hsinchu County (TW); Huai Luh Chang, Miaoli County (TW); Cheng Yi Wang, New Taipei (TW)

(73) Assignee: INPAQ TECHNOLOGY CO., LTD., Miaoli (TW)

( * ) Notice: Subject to any disclaimer, the term of this patent is extended or adjusted under 35 U.S.C. 154(b) by 98 days.

(21) Appl. No.: 14/200,291

(22) Filed: Mar. 7, 2014

(65) Prior Publication Data

US 2014/0186526 A1 Jul. 3, 2014

Related U.S. Application Data

(62) Division of application No. 13/429,864, filed on Mar. 26, 2012, now abandoned.

(30) Foreign Application Priority Data

Jul. 7, 2011 (TW) .............................. 100123985 A (51) Int. Cl.
*H01F 41/04* (2006.01)
*H01F 41/14* (2006.01)
(Continued)

(52) U.S. Cl.
CPC ............ *H01F 41/04* (2013.01); *H01F 17/0013* (2013.01); *H01F 27/255* (2013.01); *H01F 41/046* (2013.01); *H01F 41/14* (2013.01); *H01F 41/22* (2013.01); *H03H 7/427* (2013.01);

(Continued)

(58) Field of Classification Search
CPC ....... H01F 41/04; H01F 41/046; H01F 41/14; H01F 41/22; H01F 17/0013; H01F 27/255; H01F 2017/0066; H01F 2017/0073; H03H 7/427; H03H 2001/0085; Y10T 29/4902; Y10T 29/49073; Y10T 29/49069; Y10T 29/49078

See application file for complete search history.

(56) References Cited

U.S. PATENT DOCUMENTS 7,091,816 B1* 8/2006 Ito et al. ............... H01F 17/0013
2003/0048167 A1* 3/2003 Inoue et al. ......... H01F 17/0013
(Continued)

FOREIGN PATENT DOCUMENTS

CN 101202152 A 6/2008
JP 5-266411 A 10/1993
(Continued)

OTHER PUBLICATIONS

Office Action dated Feb. 19, 2014 from Taiwan counterpart application 100123985.
English translation of the Office Action dated Feb. 19, 2014 from Taiwan counterpart application 100123985, TW200609956A, JP2000173824A, CN101202152A, JP5-266411A, TW200923980A and TW201106386A1.

*Primary Examiner* — A. Dexter Tugbang
(74) *Attorney, Agent, or Firm* — WPAT, P.C.; Anthony King (57) ABSTRACT

A method of manufacturing common mode filter having heterogeneous laminates, the method includes steps of providing a nonmagnetic insulating substrate; forming a magnetic layer; forming a first lead; forming a first insulating layer; forming a first through hole; forming a first coil; forming a second insulating layer; forming a second coil; forming a third insulating layer; forming a second through hole; forming a second lead; forming a fourth insulating layer; and depositing a first magnetic material.

6 Claims, 12 Drawing Sheets

(51) Int. Cl.
H01F 41/22 (2006.01)
H01F 27/255 (2006.01)
H03H 7/42 (2006.01)
H01F 17/00 (2006.01)
H03H 1/00 (2006.01)

(52) U.S. Cl.
CPC . *H01F2017/0066* (2013.01); *H01F 2017/0073* (2013.01); *H03H 2001/0085* (2013.01); *Y10T 29/4902* (2015.01); *Y10T 29/49069* (2015.01); *Y10T 29/49073* (2015.01); *Y10T 29/49078* (2015.01)

(56) References Cited

U.S. PATENT DOCUMENTS

2007/0247268 A1* 10/2007 Oya et al. ........ H01F 2017/0066
2008/0129439 A1* 6/2008 Nishikawa et al. . H01F 17/0013

FOREIGN PATENT DOCUMENTS

| JP | 2000173824 | A |   | 6/2000 |
|----|------------|---|---|--------|
| JP | 2009094149 | A | * | 4/2009 |
| TW | 200609956  | A |   | 3/2006 |
| TW | 200923980  | A |   | 6/2009 |
| TW | 201106386  | A1|   | 2/2011 |

* cited by examiner

METHOD OF MANUFACTURING A COMMON MODE FILTER

CROSS-REFERENCE TO RELATED APPLICATION

This application is a divisional application of U.S. patent application Ser. No. 13/429,864, filed Mar. 26, 2012.

BACKGROUND OF THE INVENTION

1. Technical Field

The present invention relates to a common mode filter and a manufacturing method thereof.

2. Background

Noise can be classified into two types according to the conduction mode. The first type is differential mode noise, which is conducted on a signal line and a ground line in opposite directions. The second type is common mode noise, which is conducted on all lines in the same direction.

Common mode filters can be used to suppress common mode noise on any line on which such noise is conducted. Traditionally, a common mode filter is comprised of components including an iron core and two coils wound around the iron core with the same winding number. When common mode current flows through the common mode filter, the two coils generate magnetic flux in the same direction such that the common mode filter exhibits high impedance and can suppress common mode noise.

To address the requirement of portable electronic apparatuses, thin film common mode filters have been developed. U.S. Pat. No. 7,145,427 B2 discloses one type of thin film common mode filter, which includes two coil conductor layers, two lead-out electrode layers, a plurality of insulation layers, and two magnetic layers. Each coil conductor layer includes a coil, and the two lead-out electrode layers are used to extend the inner ends of the two coils to an edge of the thin film common mode filter for external electrical connection. The insulation layers are used for electrically insulating the coil conductor layers and the lead-out electrode layers. The coil conductor layers, the lead-out electrode layers, and the insulation layers are disposed between two magnetic layers.

U.S. Pat. No. 6,356,181 B1 and U.S. Pat. No. 6,618,929 B2 respectively disclose a laminated common mode choke, which includes a pair of magnetic substrates and a plurality of insulting layers between the pair of magnetic substrates.

U.S. Pat. No. 7,453,343 B2 discloses another thin film type common mode filter, which comprises two coil conductor layers, two lead-out electrode layers, a plurality of insulation layers, a magnetic layer, and two magnetic substrates. Each coil conductor layer includes a coil, and each lead-out electrode layer is configured to extend the inner end of the corresponding coil. The insulation layer is configured to electrically insulate the coil conductor layer and the lead-out electrode layer. The coil conductor layers, the lead-out electrode layers, and the insulation layers are disposed between the two magnetic substrates. The magnetic layer is disposed between the two magnetic substrates and attached to one magnetic substrate by a glue layer. The patent discloses that when the coil conductor width is reduced to 36 micrometers or less, the cutoff frequency of a transmission signal can be effectively increased to at least 2.4 GHz (800 MHz transmissionx3). However, because the coil conductor is narrow, the coil has high resistance such that the coil conductor cannot be formed thin. As a result, the thin film type common mode filter has a significant thickness.

The thin film type common mode filter utilizes the magnetic substrates and the magnetic layer to concentrate magnetic fields and reduce the dimension of the thin film type common mode filter. However, the magnetic substrates and the magnetic layer can easily cause energy loss, consequently causing the common mode filter to have a low quality factor. In particular, when the common mode filter is used in a radio frequency circuit, the energy loss becomes more significant. In addition, the common mode filter using magnetic substrates and a magnetic layer may have insertion loss of greater than $-20$ dB.

In order to reduce the shortcomings of the common mode filter using magnetic substrates and a magnetic layer, U.S. Pat. No. 7,821,368 B1 discloses a thin film type common mode noise filter and a fabrication method. The fabrication method forms a structure including several electric insulation layers, coil lead layers and main coil layers on an insulation substrate by lithography processes, physical vapor deposition, etching processes or other chemical processes, and subsequently covers the structure with an electric insulation gluing layer and a magnetic material layer. Such design of thin film type common mode noise filter can be formed at low production cost and has improved filtering characteristics. Although the thin film type common mode noise filter can have better filtering characteristics, the thin film type common mode noise filter has a filter bandwidth narrower than that of the common mode filtering adopting magnetic substrates.

Therefore, conventional thin film common mode filters cannot simultaneously have improved noise suppression effectiveness and a wide rejection bandwidth.

SUMMARY

One embodiment of the present invention proposes a common mode filter comprising heterogeneous laminates that is a combination of an insulating substrate and magnetic material, and a method of manufacturing the same. Compared to conventional technologies for common mode filters, the processes of the manufacturing method of the embodiment of the present invention are simpler, less expensive, and suitable for mass production. The proposed common mode filter can have characteristics of more effective noise suppression and a wide rejection bandwidth.

One embodiment of the present invention provides a common mode filter having a high quality factor such that the common mode filter can be used in high frequency applications.

One embodiment of the present invention provides a common mode filter that may concentrate magnetic fields, reduce magnetic flux leakage, and increase the bandwidth of common mode noise attenuation.

According to one embodiment of the present invention, a common mode filter having heterogeneous laminates comprises a first magnetic layer, a nonmagnetic insulating substrate, a second magnetic layer, a first coil layer, and a second coil layer. The second magnetic layer is formed on the nonmagnetic insulating substrate, and between the first magnetic layer and the nonmagnetic insulating substrate. The first coil layer is disposed between the first magnetic layer and the second magnetic layer, wherein the first coil layer comprises a first coil. The second coil layer is disposed between the first magnetic layer and the second magnetic layer, and comprises a second coil, wherein the first and second coil layers are separated from each other, and the first and second coils are magnetically coupled to each other.

According to one embodiment of the present invention, a method of manufacturing a common mode filter having heterogeneous laminates comprises providing a nonmagnetic insulating substrate comprising a major surface; forming a magnetic layer on all or part of the major surface; forming a first lead on the magnetic layer; forming a first insulating layer covering the first lead; forming a first through hole penetrating through the first insulating layer; forming a first coil on the first insulating layer, wherein the first coil electrically connects to the first lead via the first through hole; forming a second insulating layer covering the first coil; forming a second coil on the second insulating layer; forming a third insulating layer covering the second coil; forming a second through hole penetrating through the third insulating layer; forming a second lead on the third insulating layer, wherein the second lead electrically connects to the second coil via the second through hole; forming a fourth insulating layer covering the second lead; and depositing a first magnetic material on the fourth insulating layer.

The foregoing has outlined rather broadly the features of the present invention in order that the detailed description of the invention that follows may be better understood. Additional features of the invention will be described hereinafter, and form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

The objectives of the present invention will become apparent upon reading the following description and upon reference to the accompanying drawings in which.

DETAILED DESCRIPTION OF THE INVENTION

Figure 1:
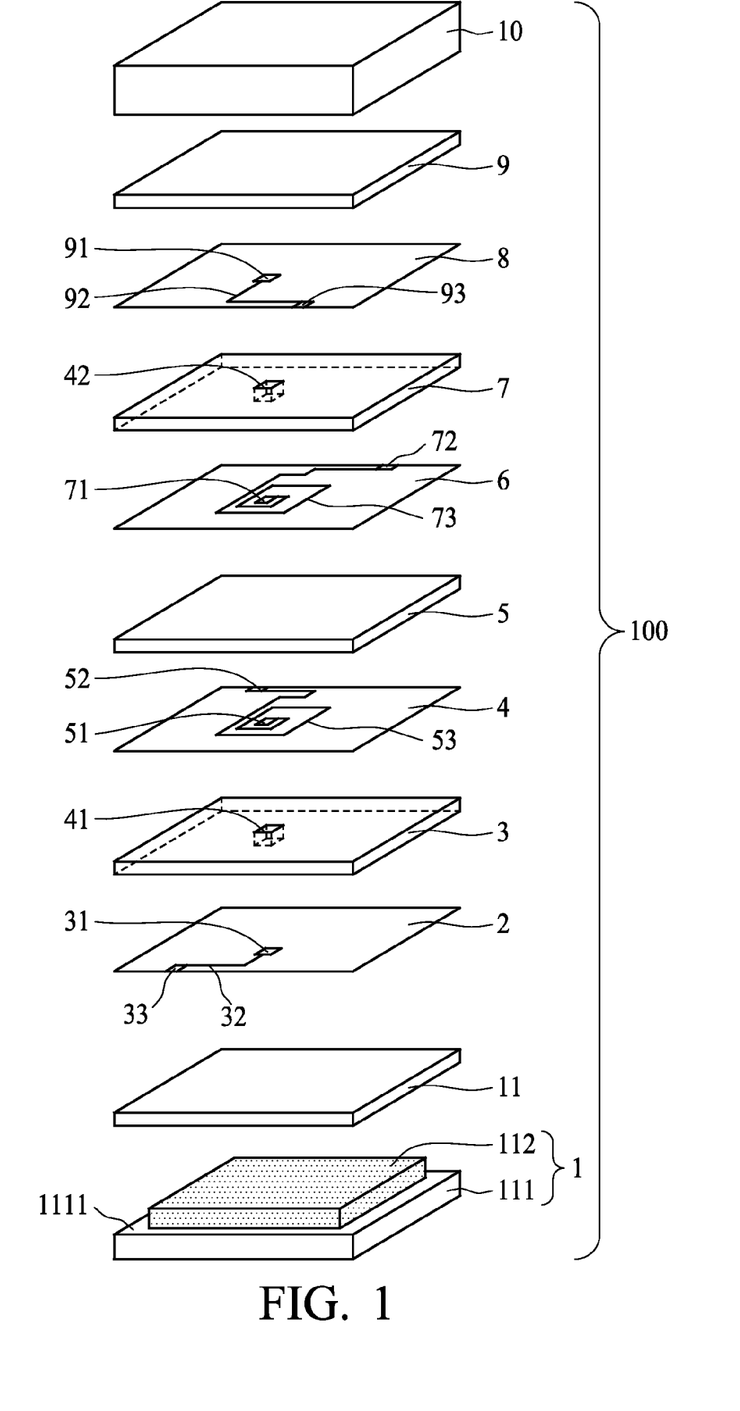
FIG. 1 is an exploded view showing a common mode filter having heterogeneous laminates according to one embodiment of the present invention.

FIG. 1 is an exploded view showing a common mode filter 100 having heterogeneous laminates according to one embodiment of the present invention. Referring to FIG. 1, the common mode filter 100 having heterogeneous laminates comprises a first magnetic layer 10, a nonmagnetic insulating substrate 111, a second magnetic layer 112, a first coil layer 4, and a second coil layer 6. The second magnetic layer 112 is formed on the nonmagnetic insulating substrate 111, and between the first magnetic layer 10 and the nonmagnetic insulating substrate 111. The first coil layer 4 is disposed between the first magnetic layer 10 and the second magnetic layer 112, and comprises a first coil 53. The second coil layer 6 is disposed between the first magnetic layer 10 and the second magnetic layer 112, and comprises a second coil 73. The first coil 53 and the second coil 73 are separated from each other so that the first and second coils 53 and 73 are electrically insulated from each other. Furthermore, the first coil 53 and the second coil 73 are arranged to be magnetically coupled with each other so that when common mode current flows through the first coil 53 and the second coil 73, magnetic flux is accumulated and common mode current can be suppressed.

In one embodiment, the common mode filter 100 may further comprise a flattening insulation layer 11, which is configured to cover the second magnetic layer 112 before the next process is performed if the surface of the second magnetic layer 112 is not sufficiently flat. The flattening insulation layer 11 may comprise polyimide, epoxy, or benzocyclobutene (BCB). The flattening insulation layer 11 may be formed from a wet film, which may be obtained by a spin coating or screen printing technique. Alternatively, the flattening insulation layer 11 may be formed from a dry film, which may be obtained by a lamination technique.

In one embodiment, the nonmagnetic insulating substrate 111 and the second magnetic layer 112 may form heterogeneous laminates 1, in which the nonmagnetic insulating substrate 111 and the second magnetic layer 112 may be combined by co-firing or glue bonding. The nonmagnetic insulating substrate 111 allows the common mode filter 100 to have a high quality factor so that the common mode filter 100 can be used in high frequency applications. Moreover, the first magnetic layer 10 and the second magnetic layer 112 can concentrate magnetic fields, reducing magnetic flux leakage and increasing the rejection bandwidth.

In one embodiment of the present invention, the nonmagnetic insulating substrate 111 comprises a major surface 1111, and the second magnetic layer 112 is formed on a portion of the major surface 1111. The nonmagnetic insulating substrate 111 and the second magnetic layer 112 are bonded together. The nonmagnetic insulating substrate 111 can reduce energy loss and allow the common mode filter 100 to have a high quality factor, but cannot concentrate magnetic fields or reduce magnetic flux leakage. In contrast, because the second magnetic layer 112 is formed on a portion of the major surface 1111 of the insulating substrate 111, magnetic fields can be concentrated, reducing magnetic flux leakage, increasing the rejection bandwidth, and allowing the common mode filter 100 to have a high quality factor. In one embodiment of the present invention, the second magnetic layer 112 is formed on the entire major surface 1111 of the nonmagnetic insulating substrate 111.

The nonmagnetic insulating substrate 111 can be made of any insulating material suitable for a common mode filter. The nonmagnetic insulating substrate 111 may cause the common mode filter 100 to have reduced energy loss, especially when the common mode filter 100 is used in a radio frequency circuit or a high frequency circuit. Preferably, the nonmagnetic insulating substrate 111 may comprise aluminum oxide ($Al_2O_3$), aluminum nitride (AlN), glass, or quartz crystal.

The second magnetic layer 112 may have high permeability, which may comprise ferrites. Preferably, the second magnetic layer 112 may comprise nickel zinc ferrite material (NiZn ferrite material) or manganese zinc ferrite material (MnZn ferrite material). In addition, the second magnetic layer 112 may comprise a mixture of a polymer and magnetic powder. The polymer may comprise polyimide or epoxy, and the magnetic powder may comprise ferrites. Preferably, the magnetic powder may comprise nickel zinc ferrite material or manganese zinc ferrite material.

The first magnetic layer 10 may comprise a magnetic material, especially a magnetic material including polymer. Alternatively, the first magnetic layer 10 may be made from a mixture of polymer and magnetic powder. The magnetic powder may comprise ferrites. Preferably, the magnetic powder may comprise nickel zinc ferrite material or manganese zinc ferrite material, and the polymer may comprise polyimide, epoxy, or benzocyclobutene.

Referring again to FIG. 1, the common mode filter 100 may further comprise a first lead layer 2, a first insulating layer 3, a second insulating layer 5, a third insulating layer 7, a second lead layer 8, and a fourth insulating layer 9, all of which are sequentially formed on the flattening insulation layer 11, constituting a laminated structure.

In particular, the first lead layer 2 is formed on the flattening insulation layer 11 and may comprise a first electrode 31, a lead 32, and a second electrode 33. One end of the lead 32 connects with the first electrode 31, and another end of the lead 32 extends adjacent to an edge of the flattening insulation layer 11, connecting with the second electrode 33 disposed adjacent to the afore-mentioned edge of the flattening insulation layer 11.

The first insulating layer 3 is formed between the first lead layer 2 and the first coil layer 4 to electrically insulate the first lead layer 2 and the first coil layer 4. The first insulating layer 3 may comprise a first through hole 41, which penetrates the first insulating layer 3. The first electrode 31 may protrude into the first through hole 41. In one embodiment of the present invention, the material of the first insulating layer 3 may comprise polyimide, epoxy, or benzocyclobutene.

The first coil layer 4 may further comprise a first electrode 51 and a second electrode 52. The first coil 53 may be a flat spiral coil, which may comprise an inner end and an outer end. The first electrode 51 may be coupled with the inner end of the first coil 53, protruding into the first through hole 41 of the first insulating layer 3 and connecting with the first electrode 31 of the first lead layer 2 so that the inner end of the first coil 53 is available for external electrical connection. The outer end of the first coil 53 may extend adjacent to an edge of the first insulating layer 3, coupled with the second electrode 52 adjacent to the same edge of the first insulating layer 3. The first electrode 51, the second electrode 52, and the first coil 53 can be made of metal, which may comprise silver, palladium, aluminum, chromium, nickel, titanium, gold, copper, platinum, or an alloy thereof.

The second insulating layer 5 may be formed between the first coil layer 4 and the second coil layer 6 to electrically insulate the first coil layer 4 and the second coil layer 6. In one embodiment of the present invention, the second insulating layer 5 may comprise polyimide, epoxy, or benzocyclobutene.

Similarly, the second coil layer 6 may further comprise a first electrode 71 and a second electrode 72. The second coil 73 may be a flat spiral coil, and may comprise an inner end and an outer end. The first electrode 71 is coupled with the inner end of the second coil 73. The outer end of the second coil 73 extends adjacent to an edge of the second insulating layer 5, electrically connecting with the second electrode 72 disposed adjacent to the edge of the second insulating layer 5. The first electrode 71, the second electrode 72 and the second coil 73 can be made of a material such as silver, palladium, aluminum, chromium, nickel, titanium, gold, copper, platinum, or an alloy thereof.

The third insulating layer 7 may be formed on the second coil layer 6, covering the first electrode 71, the second electrode 72 and the second coil 73 so as to electrically insulate the second coil layer 6. In one embodiment of the present invention, the material of the third insulating layer 7 may comprise polyimide, epoxy, or benzocyclobutene. The third insulating layer 7 may comprise a second through hole 42, which penetrates through the third insulating layer 7.

The second lead layer 8 is formed on the third insulating layer 7 and comprises a first electrode 91, a lead 92 and a second electrode 93, wherein one end of the lead 92 connects with the first electrode 91, and another end of the lead 92 extends adjacent to an edge of the third insulating layer 7, connecting with the second electrode 93 disposed adjacent to the edge of the third insulating layer 7. The first electrode 71 of the second coil layer 6 and the first electrode 91 on the third insulating layer 7 protrude into the through hole 42 and are coupled with each other. As such, the inner end of the second coil 73 of the second coil layer 6 is available for an external electrical connection. The first electrode 91, the lead 92 and the second electrode 93 can be made of a material, which may comprise silver, palladium, aluminum, chromium, nickel, titanium, gold, copper, platinum, or an alloy thereof.

The fourth insulating layer 9 is formed between the second lead layer 8 and the first magnetic layer 10 to electrically insulate the second lead layer 8 and the first magnetic layer 10. The fourth insulating layer 9 may be made of a material comprising polyimide, epoxy, or benzocyclobutene.

Figure 2:
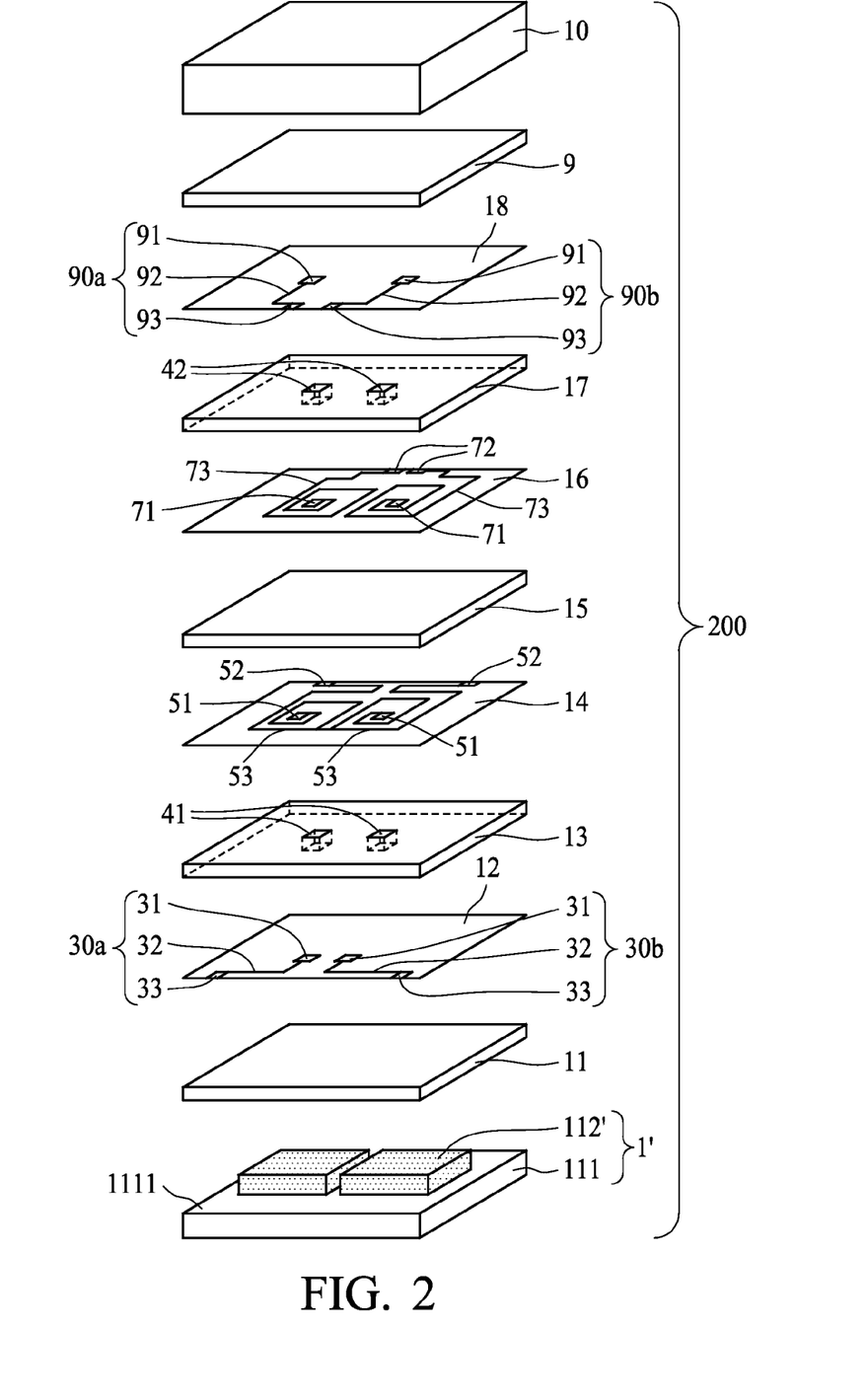
FIG. 2 is an exploded view showing a common mode filter according to another embodiment of the present invention.

FIG. 2 is an exploded view showing a common mode filter 200 according to another embodiment of the present invention. Referring to FIG. 2, the common mode filter 200 comprises a laminated structure and material compositions similar to those of the common mode filter 100 of the embodiment of FIG. 1 except that the first coil layer 14 of the common mode filter 200 comprises two first coils 53, and the second coil layer 16 of the common mode filter 200 comprises two second coils 73. Each first coil 53 connects with a first electrode 51 located inside the first coil 53 and connects with a second electrode 52 disposed adjacent to an edge of the common mode filter 200. Each second coil 73 connects with a first electrode 71 located inside the second coil 73 and connects with a second electrode 72 disposed adjacent to an edge of the common mode filter 200.

The common mode filter 200 may comprise a nonmagnetic insulating substrate 111 and a second magnetic layer 112', two of which may be combined by co-firing or glue bonding to form heterogeneous laminates 1'. The nonmagnetic insulating substrate 111 may make the common mode filter 200 have a high quality factor so that the common mode filter 200 can be used in high frequency applications. Furthermore, the second magnetic layer 112' and the first magnetic layer 10 can concentrate magnetic fields, reducing magnetic flux leakage and increasing the rejection bandwidth.

In one embodiment of the present invention, the second magnetic layer 112' comprises a plurality of magnetic material pieces as shown in FIG. 2, in which the plurality of magnetic material pieces are separated from each other. In one embodiment of the present invention, the second magnetic layer 112' may comprise two magnetic material pieces, wherein the two magnetic material pieces are disposed with respect to the two first coils 53 or the two second coils 73.

In one embodiment, when the second magnetic layer 112' cannot provide a sufficiently flat surface for the next stacking layer, the common mode filter 200 may further comprise a flattening insulation layer 11, which is formed on the second magnetic layer 112'.

The first lead layer 12 is formed on the flattening insulation layer 11 and comprises two lead sets 30a and 30b. Each lead set 30a or 30b comprises a first electrode 31, a lead 32 and a second electrode 33. The two lead sets 30a and 30b correspond to the two first coils 53 of the first coil layer 14 or the two second coils 73 of the second coil layer 16.

The first insulating layer 13 is formed to electrically insulate the first lead layer 12 and the first coil layer 14. The first insulating layer 13 comprises two first through holes 41, in which the two first electrodes 31 of the first lead layer 12 and the two first electrodes 51 of the first coil layer 14 are respectively coupled. As such, the two first electrodes 51 of the first coil layer 14 are available for external electrical connection.

The second insulating layer 15 may electrically insulate the first coil layer 14 and the second coil layer 16. The first coils 53 of the first coil layer 14 correspond to the two second coils 73 of the second coil layer 16, wherein each first coil 53 is magnetically coupled with the respective second coil 73.

The third insulating layer 17 is formed on the second coil layer 16 and comprises two second through holes 42, which are disposed corresponding to the first electrodes 71 of the two second coils 73.

The second lead layer 18 is formed on the third insulating layer 17 and comprises two lead sets 90a and 90b, each of which comprises a first electrode 91, a lead 92 and a second electrode 93. The lead sets 90a and 90b are disposed with respect to the two second coils 73 of the second coil layer 16. The first electrodes 91 of the two lead sets 90a and 90b and the two first electrodes 71 of the second coil layer 16 are respectively coupled with each other in the two second through holes 42 so that the inner ends of the two second coils 73 are available for external electrical connection.

The fourth insulating layer 9 is formed on the second lead layer 18, and subsequently, a first magnetic layer 10 is disposed on the fourth insulating layer 9. As a result, the laminated structure of the common mode filter 200 is completed.

Figure 3:
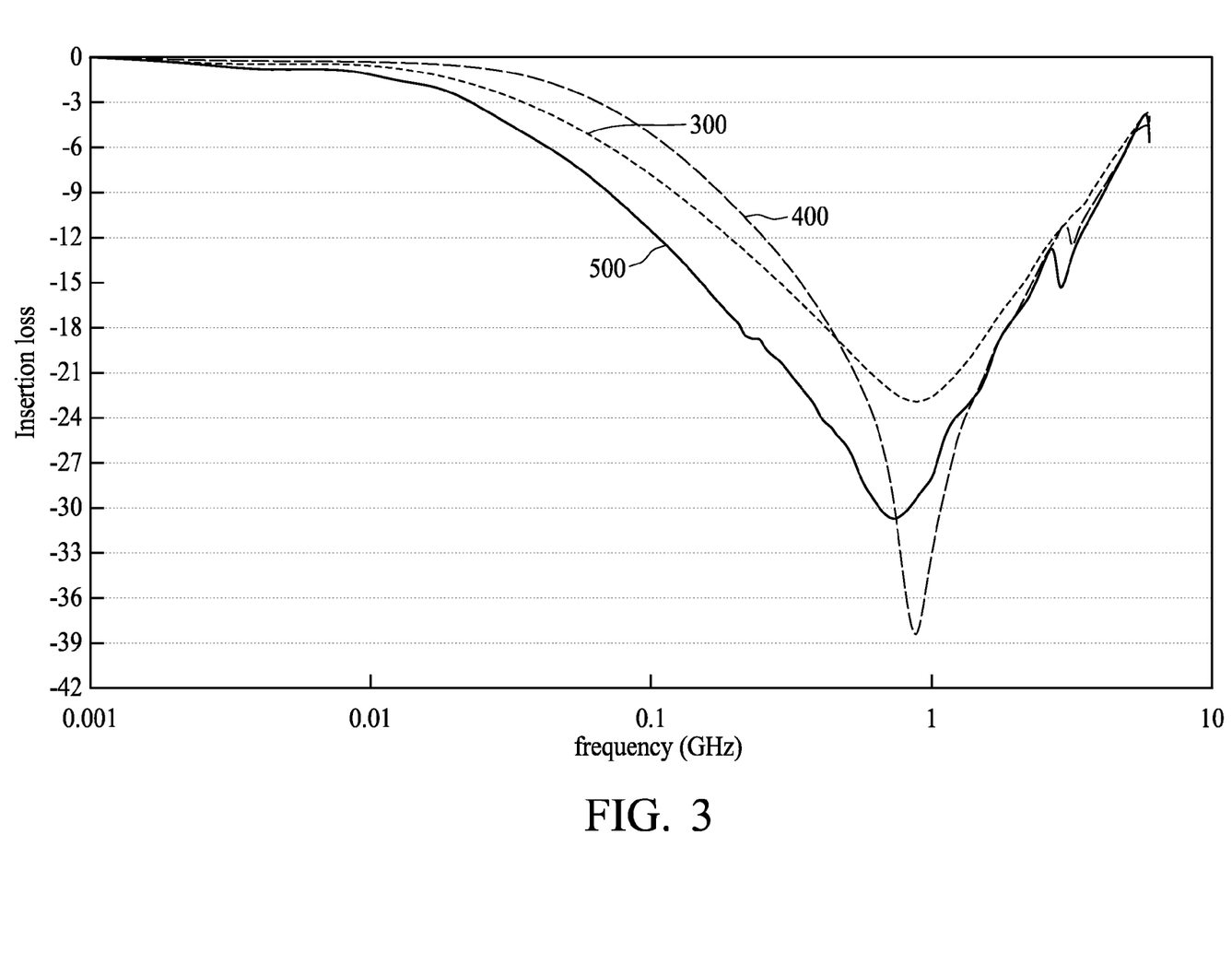
FIG. 3 is a diagram showing insertion loss of a conventional common mode filter and the common mode filter of an embodiment of the present invention versus frequency.

FIG. 3 is a diagram showing insertion loss of a conventional common mode filter and the common mode filter of an embodiment of the present invention versus frequency. As shown in FIG. 3, tests are performed on a common mode filter including homogeneous magnetic substrates, a common mode filter including homogeneous insulating substrates, and a common mode filter including heterogeneous laminates in accordance with one embodiment of the present invention. It can be found that the common mode filter including homogeneous magnetic substrates can have a wider rejection bandwidth (as shown by curve 300) because it includes the magnetic substrates that can concentrate magnetic fields in comparison to other common mode filters. The common mode filter including homogeneous insulating substrates can have a higher quality factor so that it can more effectively suppress noise (as shown by curve 400) because of insulating substrates. In comparison, because the heterogeneous laminates of one embodiment of the present invention can simultaneously have the above characteristics of the homogeneous magnetic substrate and the homogeneous insulating substrate, the common mode filter of one embodiment of the present invention can simultaneously have both better noise suppression effectiveness and a wide rejection bandwidth (as shown by curve 500).

Figure 4A:
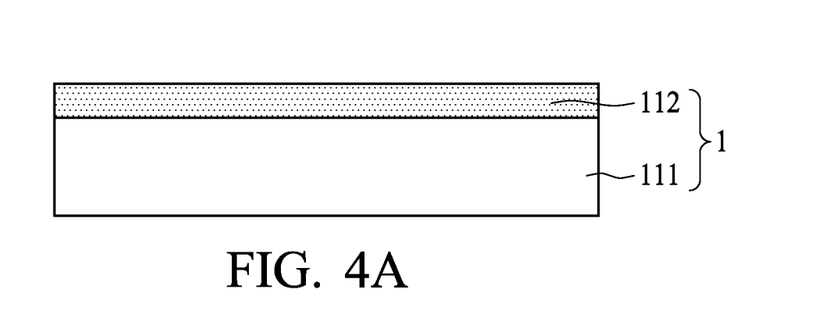
FIGS. 4A to 4J are cross-sectional views schematically demonstrating the steps of a method of manufacturing a common mode filter according to one embodiment of the present invention.

FIGS. 4A to 4J are cross-sectional views schematically demonstrating the steps of a method of manufacturing a common mode filter according to one embodiment of the present invention. As shown in FIG. 4A, a nonmagnetic insulating substrate 111 is provided. Next, a second magnetic layer 112 is formed on at least a portion of a major surface of the nonmagnetic insulating substrate 111 to obtain heterogeneous laminates 1. The nonmagnetic insulating substrate 111 may comprise aluminum oxide, aluminum nitride, glass, or quartz crystal. The second magnetic layer 112 may comprise nickel zinc ferrite material or manganese zinc ferrite material. The second magnetic layer 112 may cover part or all of the nonmagnetic insulating substrate 111.

Figure 4B:
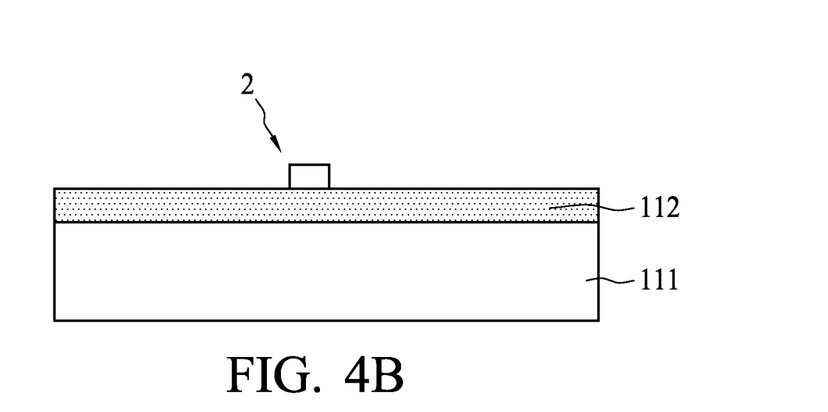

Referring to FIG. 4B, thin film deposition, lithography and electroplating processes are applied to form a first lead layer 2. The first lead layer 2 may comprise a material comprising silver, palladium, aluminum, chromium, nickel, titanium, gold, copper, platinum, or an alloy thereof. As shown in FIG. 1, the first lead layer 2 may comprise a first electrode 31, a lead 32 and a second electrode 33, wherein the lead 32 has one end that connects with the first electrode 31 and another end that connects with the second electrode 33.

In one embodiment, a flattening insulation layer 11 as shown in FIG. 1 can be formed between the first lead layer 2 and the second magnetic layer 112. The flattening insulation layer 11 can be formed by a spin coating or screen printing technique and covers the second magnetic layer 112, or by a lamination technique to cover the second magnetic layer 112.

Figure 4C:
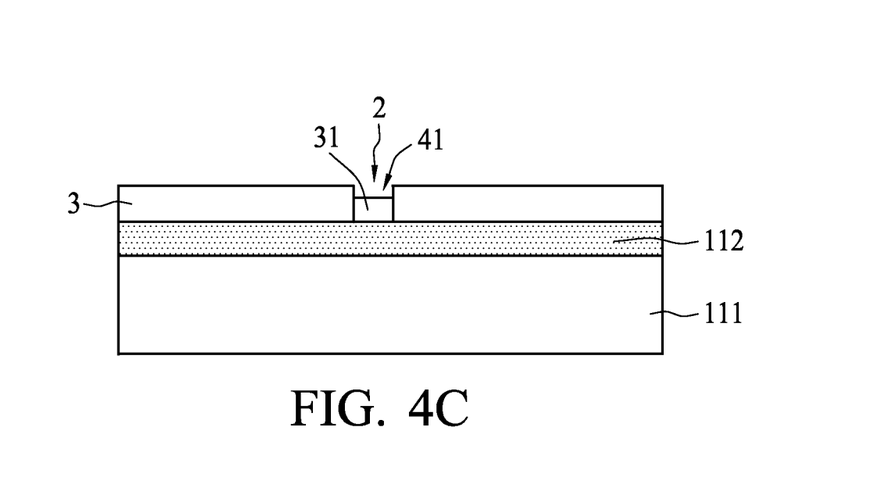

As shown in FIG. 4C, a first insulating layer 3 is formed on the first lead layer 2. Thereafter, lithography and etch processes are applied to form a first through hole 41 on the first insulating layer 3, at the location of the first electrode 31 of the first lead layer 2. The first electrode 31 of the first lead layer 2 may protrude into the first through hole 41. The material of the first insulating layer 3 may comprise polyimide, epoxy, or benzocyclobutene.

Figure 4D:
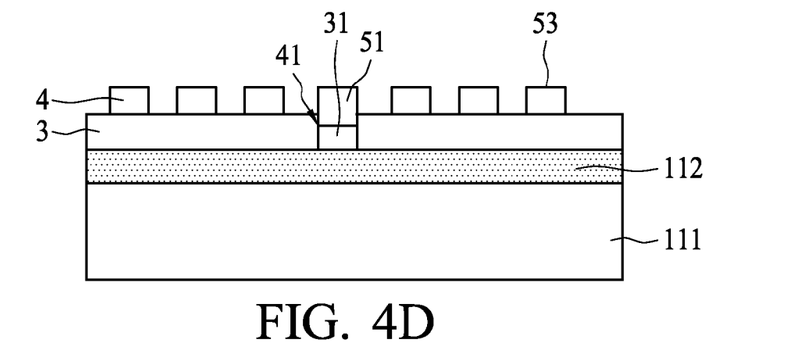

Referring to FIG. 4D, thin film deposition, lithography and electroplating processes are utilized to form a first coil layer 4 on the first insulating layer 3. As illustrated in FIG. 1, the first coil layer 4 may comprise a first electrode 51, a second electrode 52 and a first coil 53. The first coil 53 may be spiral. The first electrode 51 is coupled with an inner end of the first coil 53, protrudes into the first through hole 41 of the first insulating layer 3, and connects with the first electrode 31 of the first lead layer 2. The first coil layer 4 may be made of metal, which may comprise silver, palladium, aluminum, chromium, nickel, titanium, gold, copper, platinum, or an alloy thereof.

Figure 4E:
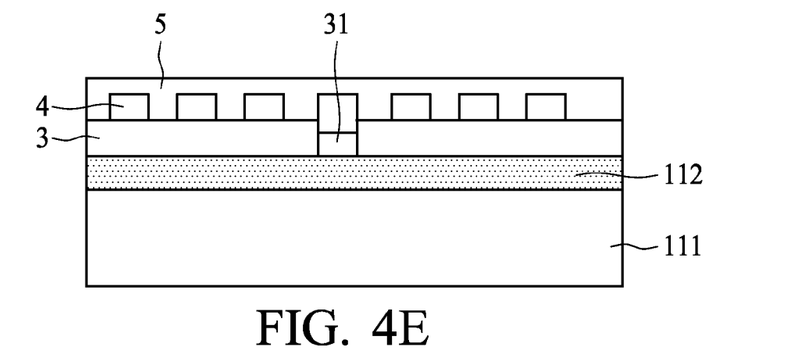

Referring to FIG. 4E, a second insulating layer 5 is deposited on the first coil layer 4. The material of the second insulating layer 5 may comprise polyimide, epoxy, or benzocyclobutene.

Figure 4F:
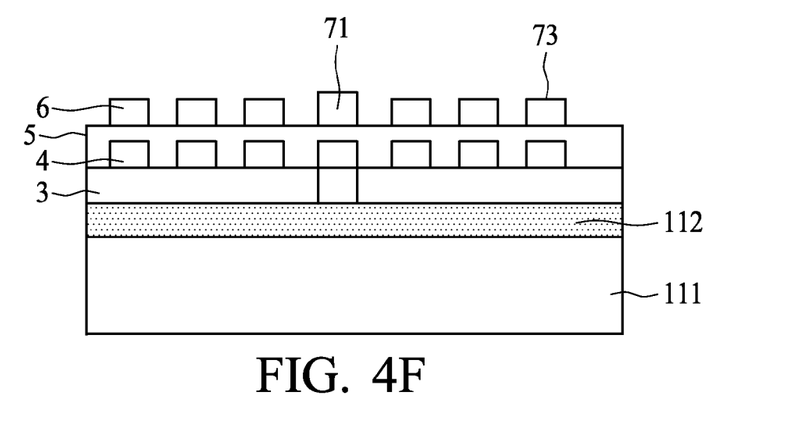

As shown in FIG. 4F, thin film deposition, lithography and electroplating processes are applied to form a second coil layer 6 on the second insulating layer 5. The second coil layer 6 comprises a first electrode 71, a second electrode 72 and a second coil 73. As shown in FIG. 1, the second coil 73 may be spiral. The first electrode 71 is coupled with an inner end of the second coil 73, and the second electrode 72 is coupled with an outer end of the second coil 73. The second coil layer 6 may be made of metal, which may comprise silver, palladium, aluminum, chromium, nickel, titanium, gold, copper, platinum, or an alloy thereof.

Figure 4G:
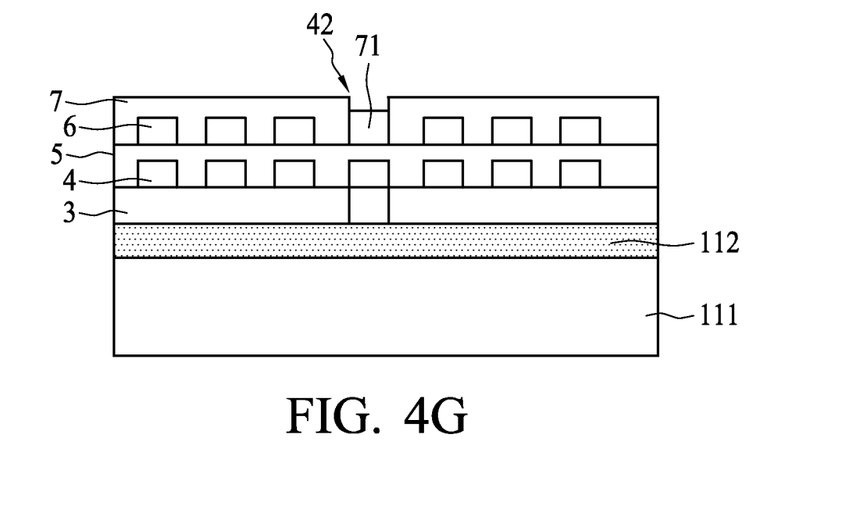

As shown in FIG. 4G, a third insulating layer 7 is deposited on the second coil layer 6. Next, lithography and etch processes are used to form a second through hole 42 on the third insulating layer 7, at the location of the first electrode 71 of the second coil layer 6. The first electrode 71 of the second coil layer 6 may protrude into the second through hole 42. The material of the third insulating layer 7 may comprise polyimide, epoxy, or benzocyclobutene.

Figure 4H:
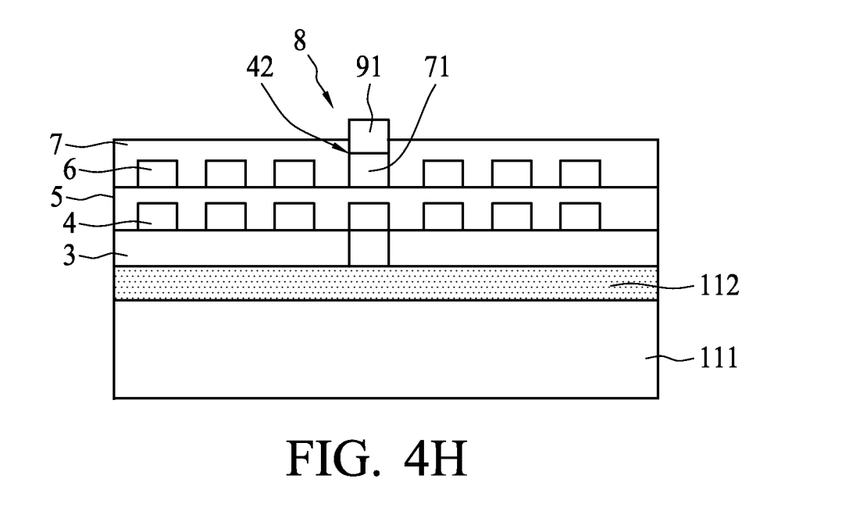

As shown in FIG. 4H, thin film deposition, lithography and electroplating processes are applied to form a second lead layer 8 on the third insulating layer 7. The material of the second lead layer 8 may comprise metal, which may comprise silver, palladium, aluminum, chromium, nickel, titanium, gold, copper, platinum, or an alloy thereof. As illustrated in FIG. 1, the second lead layer 8 comprises a first electrode 91, a lead 92, and a second electrode 93, wherein the lead 92 has one end connecting with the first electrode 91 and another end connecting with the second electrode 93. The first electrode 91 of the second lead layer 8 protrudes into the second through hole 42 of the third insulating layer 7, coupled with the first electrode 71 of the second coil layer 6 residing in the second through hole 42.

Figure 4I:
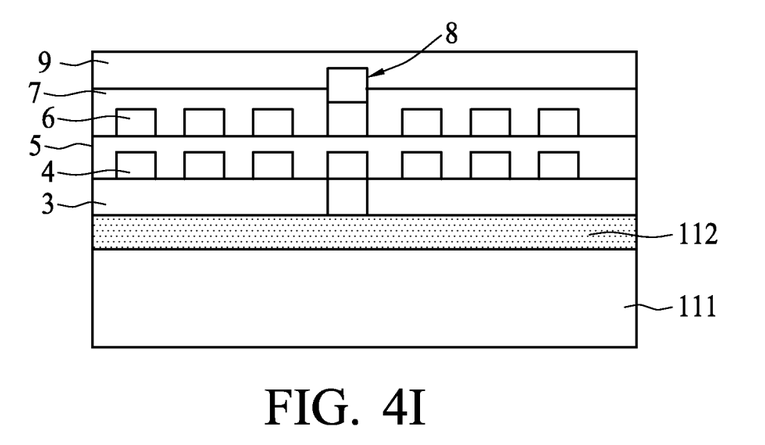

Referring to FIG. 4I, an insulating material is deposited on the second lead layer 8 to form a fourth insulating layer 9. The material of the fourth insulating layer 9 may comprise polyimide, epoxy, or benzocyclobutene.

Figure 4J:
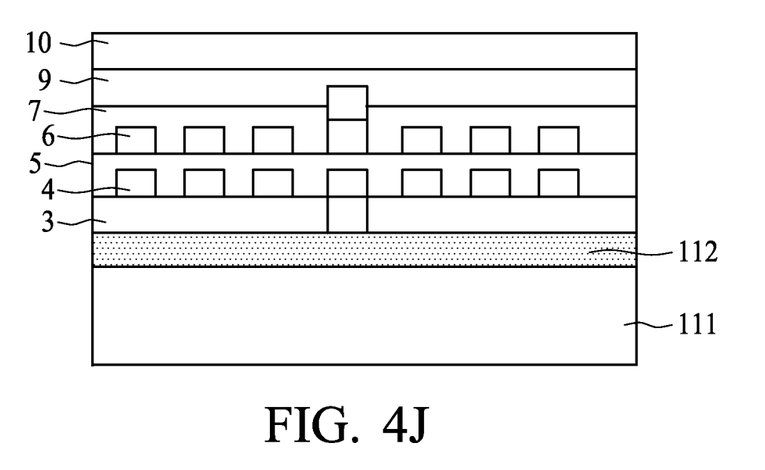

As shown in FIG. 4J, a first magnetic layer 10 is disposed on the fourth insulating layer 9. The first magnetic layer 10 may be used as an upper cover of the common mode filter. The first magnetic layer 10 can be directly bonded to the fourth insulating layer 9 by glue. The first magnetic layer 10 may comprise ferrites, preferably nickel zinc ferrite material or manganese zinc ferrite material. The first magnetic layer 10 may be formed by screen printing or coating a mixture of magnetic powder and a polymer onto the fourth insulating layer 9. The magnetic powder may comprise ferrites, preferably nickel zinc ferrite material or manganese zinc ferrite material. The polymer may comprise polyimide, epoxy, or benzocyclobutene.

Figure 5A:
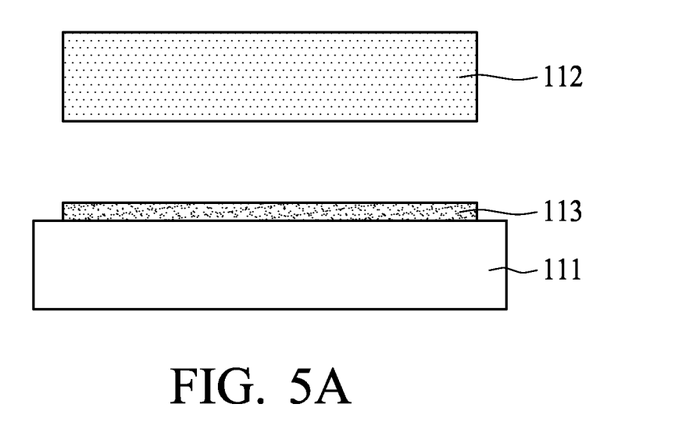
FIGS. 5A and 5B are cross-sectional views showing the steps of a method for forming a second magnetic layer on a nonmagnetic insulating substrate according to one embodiment of the present invention.
Figure 5B:
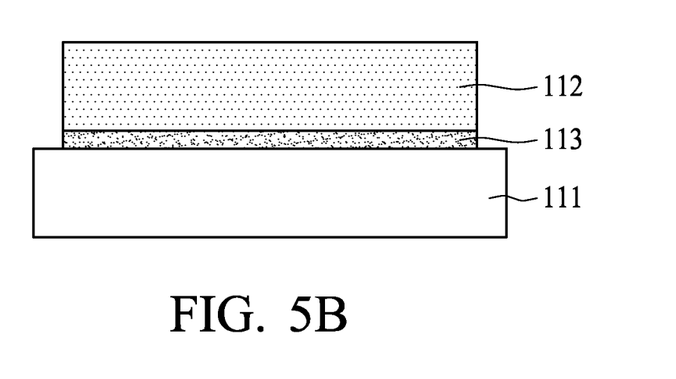

FIGS. 5A and 5B are cross-sectional views showing the steps of a method for forming a second magnetic layer 112 on a nonmagnetic insulating substrate 111 according to one embodiment of the present invention. Referring to FIGS. 5A and 5B, a second magnetic layer 112 and a nonmagnetic insulating substrate 111 are initially provided. Thereafter, an adhesive 113 is applied to form an adhesive layer on the nonmagnetic insulating substrate 111. Finally, the second magnetic layer 112 is attached to the adhesive 113.

Figure 6A:
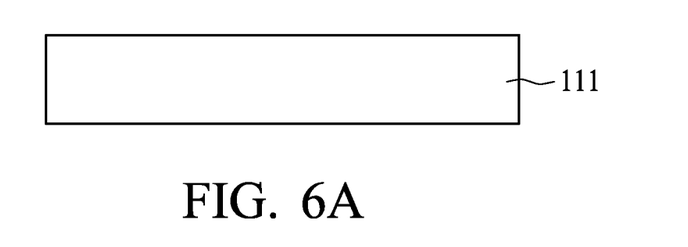
FIGS. 6A and 6B are cross-sectional views showing the steps of a method for forming a second magnetic layer on a nonmagnetic insulating substrate according to another embodiment of the present invention.
Figure 6B:
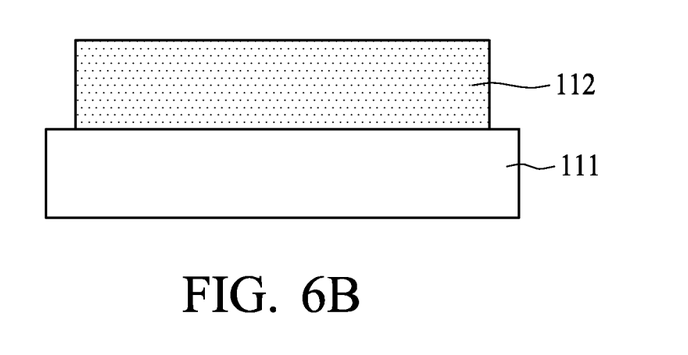

FIGS. 6A and 6B are cross-sectional views showing the steps of a method for forming a second magnetic layer 112 on a nonmagnetic insulating substrate 111 according to another embodiment of the present invention. Referring to FIG. 6A, a nonmagnetic insulating substrate 111 is introduced. As shown in FIG. 6B, a second magnetic layer 112 is applied to cover the nonmagnetic insulating substrate 111. The second magnetic layer 112 can be formed by coating a magnetic material on the nonmagnetic insulating substrate 111. The second magnetic layer 112 may also be a magnetic substrate, and may be temporarily attached to the nonmagnetic insulating substrate 111. Next, the nonmagnetic insulating substrate 111 and the second magnetic layer 112 are co-fired such that the nonmagnetic insulating substrate 111 and the second magnetic layer 112 are diffusion bonded.

Figure 7A:
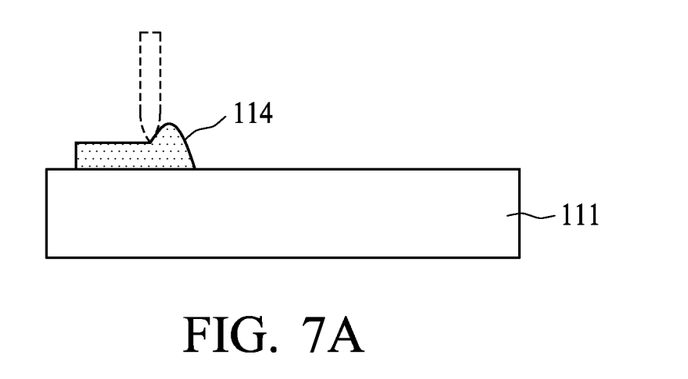
FIGS. 7A and 7B are cross-sectional views showing the steps of a method for forming a second magnetic layer on a nonmagnetic insulating substrate according to another embodiment of the present invention.
Figure 7B:
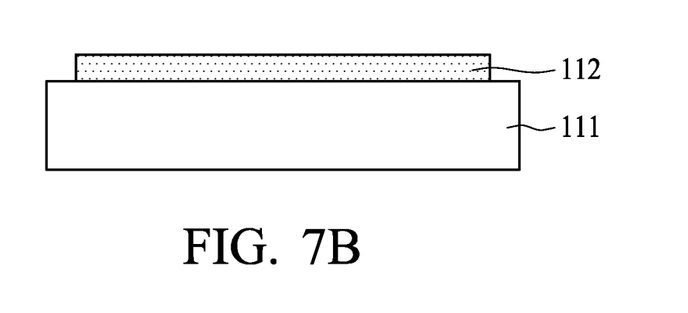

FIGS. 7A and 7B are cross-sectional views showing the steps of a method for forming a second magnetic layer 112 on a nonmagnetic insulating substrate 111 according to another embodiment of the present invention. Referring to FIGS. 7A and 7B, a mixture 114 is obtained by mixing magnetic powder and a polymer. Next, the mixture 114 is deposited on the nonmagnetic insulating substrate 111 by a screen-printing or coating technique to obtain a second magnetic layer 112 on the nonmagnetic insulating substrate 111.

Figure 8:
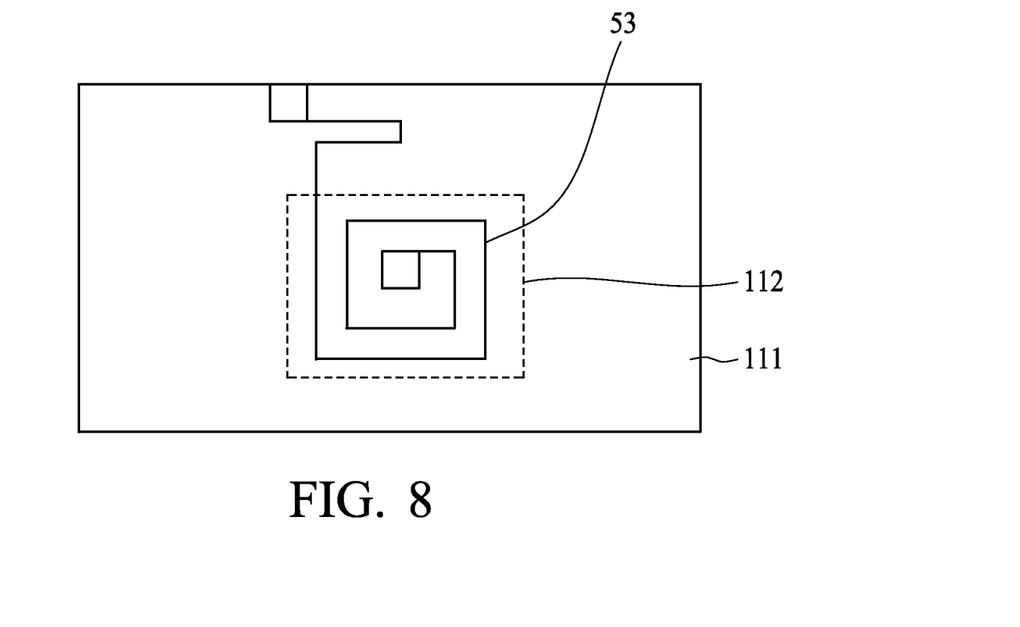
FIG. 8 is a view schematically showing a second magnetic layer according to one embodiment of the present invention.

FIG. 8 is a view schematically showing a second magnetic layer 112 according to one embodiment of the present invention. Referring to FIGS. 1 and 8, the second magnetic layer 112 is formed on a major surface of a nonmagnetic insulating substrate 111 and corresponds to the first coil 53 and the second coil 73 such that the first coil 53 and the second coil 73 are located between the second magnetic layer 112 and the first magnetic layer 10. In one embodiment, the second magnetic layer 112 can have an area greater than that occupied by the first coil 53 or the second coil 73, but smaller than that of the major surface.

Figure 9:
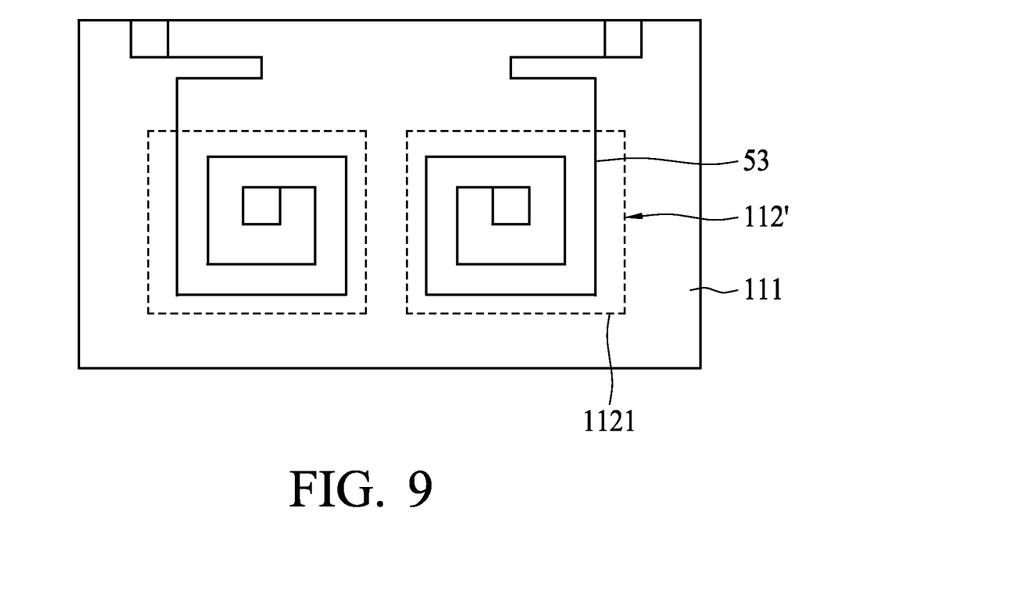
FIG. 9 is a view schematically showing a second magnetic layer according to another embodiment of the present invention.

FIG. 9 is a view schematically showing a second magnetic layer 112' according to another embodiment of the present invention. Referring to FIGS. 2 and 9, the second magnetic layer 112' may comprise a plurality of magnetic material pieces 1121, each corresponding to a group of the first and second coils 53 and 73 and formed on a major surface of a nonmagnetic insulating substrate 111.

Figure 10:
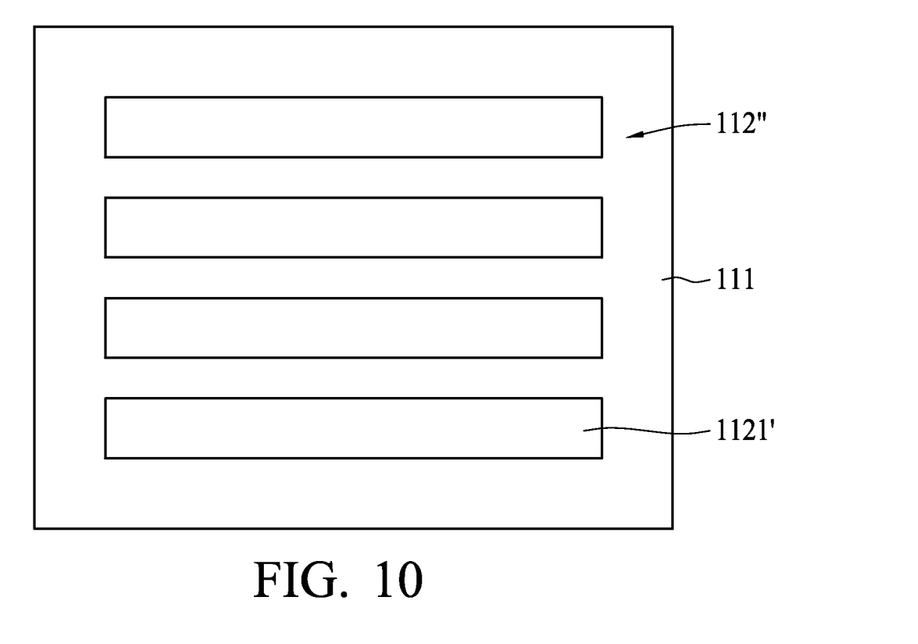
FIG. 10 is a view schematically showing a second magnetic layer according to another embodiment of the present invention.

FIG. 10 is a view schematically showing a second magnetic layer 112" according to another embodiment of the present invention. Referring to FIG. 10, the second magnetic layer 112" may comprise a plurality of strip-like magnetic material pieces 1121', which may be arranged in order on a major surface of a nonmagnetic insulating substrate 111.

Figure 11:
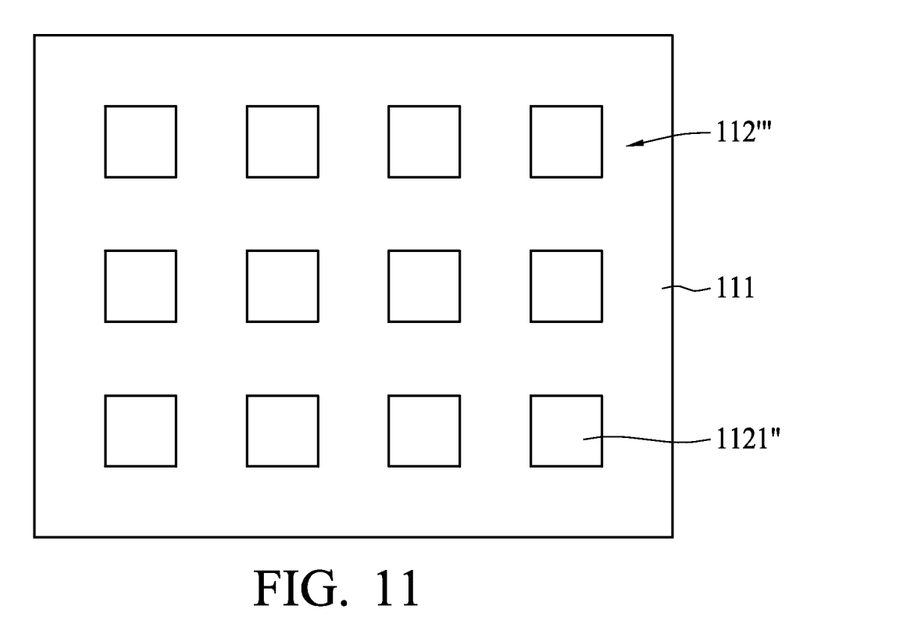
FIG. 11 is a view schematically showing a second magnetic layer according to one embodiment of the present invention.

FIG. 11 is a view schematically showing a second magnetic layer 112''' according to one embodiment of the present invention. Referring to FIG. 11, the second magnetic layer 112''' may comprise a plurality of rectangular magnetic material pieces 1121", which may be arrayed on a major surface of a nonmagnetic insulating substrate 111.

Although the present invention and its objectives have been described in detail, it should be understood that various changes, substitutions and alterations can be made herein without departing from the spirit and scope of the invention as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of manufacturing a common mode filter having heterogeneous laminates, the method comprising the steps of:

providing a nonmagnetic insulating substrate comprising a major surface;
forming a magnetic layer on part or all of the major surface;
forming a first lead on the magnetic layer;
forming a first insulating layer covering the first lead;
forming a first through hole penetrating through the first insulating layer;
forming a first coil on the first insulating layer, wherein the first coil electrically connects to the first lead via the first through hole;
forming a second insulating layer covering the first coil;
forming a second coil on the second insulating layer;
forming a third insulating layer covering the second coil;
forming a second through hole penetrating through the third insulating layer;
forming a second lead on the third insulating layer, wherein the second lead electrically connects to the second coil via the second through hole;
forming a fourth insulating layer covering the second lead; and
depositing a first magnetic material on the fourth insulating layer;
wherein the magnetic layer comprises a plurality of magnetic material pieces horizontally separated from each other;
wherein the plurality of magnetic material pieces has an area that is larger than that occupied by the first coil or the second coil and is smaller than that of the major surface.

2. The method of claim 1, wherein the step of forming a magnetic layer on part or all of the major surface comprises a step of bonding the magnetic layer to the nonmagnetic insulating substrate by an adhesive.

3. The method of claim 1, wherein the step of forming a magnetic layer on part or all of the major surface comprises the steps of:
    depositing a second magnetic material on the nonmagnetic insulating substrate; and
    co-firing the second magnetic material and the nonmagnetic insulating substrate.

4. The method of claim 1, wherein the step of forming a magnetic layer on part or all of the major surface comprises the steps of:
    mixing magnetic powder and a polymer to obtain a mixture; and
    depositing the mixture on the nonmagnetic insulating substrate.

5. The method of claim 4, wherein the magnetic powder comprises nickel zinc ferrite or manganese zinc ferrite, and the polymer comprises polyimide, epoxy, or benzocyclobutene.

6. The method of claim 1, further comprising a step of forming a flattening insulation layer on the magnetic layer.

* * * * *